United States Patent
Nierle

(10) Patent No.: US 7,072,234 B1
(45) Date of Patent: Jul. 4, 2006

(54) METHOD AND DEVICE FOR VARYING AN ACTIVE DUTY CYCLE OF A WORDLINE

(75) Inventor: Klaus Nierle, Essex Junction, VT (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/048,836

(22) Filed: Feb. 2, 2005

(51) Int. Cl.
*G11C 7/00* (2006.01)

(52) U.S. Cl. .................. 365/203; 365/201; 365/230.06

(58) Field of Classification Search ................ 365/203, 365/201, 230.06
See application file for complete search history.

(56) References Cited

U.S. PATENT DOCUMENTS

| | | | |
|---|---|---|---|
| 6,272,588 B1 | 8/2001 | Johnston et al. | |
| 6,389,564 B1 | 5/2002 | Lu | |
| 6,453,433 B1 | 9/2002 | Vollrath | |
| 6,484,278 B1 | 11/2002 | Merritt et al. | |
| 6,512,711 B1 | 1/2003 | Wright et al. | |
| 6,850,454 B1* | 2/2005 | Kuge et al. | 365/227 |
| 2003/0185075 A1* | 10/2003 | Park et al. | 365/203 |
| 2004/0145959 A1* | 7/2004 | Kuge et al. | 365/230.03 |

* cited by examiner

*Primary Examiner*—Huan Hoang
(74) *Attorney, Agent, or Firm*—Slater & Matsil, L.L.P

(57) ABSTRACT

A semiconductor memory is provided which is operable in at least a test mode. Such semiconductor memory includes a memory array, the memory array including a plurality of memory cells which are accessible through a plurality of respective wordlines and a plurality of respective bitlines. A row decoder driver is operable to activate one wordline of the plurality of wordlines at a first point in time that is determined in relation to a first signal and to deactivate the wordline at a second point in time that is determined in relation to a second signal. The semiconductor memory further includes a precharge circuit which is operable to precharge the bitline at a third point in time, the third point in time occurring no sooner than the second point in time. A variable length delay circuit is operable to output the second signal at a delayed timing after the first signal and delayed in relation to the first signal, the delayed timing having a controllably variable length.

20 Claims, 6 Drawing Sheets

METHOD AND DEVICE FOR VARYING AN ACTIVE DUTY CYCLE OF A WORDLINE

TECHNICAL FIELD

The present invention relates to semiconductor integrated circuits and their testing.

BACKGROUND

Production testing of semiconductor integrated circuits, also referred to as "chips" herein, requires that not only devices which fail solidly be identified and dealt with, but also devices which operate marginally, i.e., those whose operation is near failing. It is common for marginal devices to be taken offline and replaced with devices which test good in order to avoid them failing later when a more costly repair would be required. Alternatively, marginal devices can be allowed to remain a part of the operating configuration, provided that the chip is appropriately tagged and the marginality of its devices are identified to downstream users which incorporate the marginal chip into further equipment. Stated another way, some chips which operate satisfactorily under certain restricted conditions, e.g., less frequent use, shorter lifetime, shorter power-on-time per day, or under better controlled temperatures, but which are likely to fail outside of such conditions may nevertheless be usable if tagged as being marginal and restricted to such use or uses.

Semiconductor memories include particular devices that are subject to variation in operating characteristics, such as due to unavoidable non-uniformities in the processing of the devices. This is particularly true of dynamic random access memories ("DRAMs"), because the design of DRAMS tends to favor the optimization of circuit density and cost. Such variations can cause some of the millions (or even billions) of memory cells of a DRAM to either fail at the time of production test, or to operate marginally at that time. Unfortunately, to downstream equipment which incorporates the chip, marginally operating memory cells can inflict greater harm than those which fail solidly during initial testing. Frequently, the marginally operating memory cell will fail hard later during the expected lifetime of the DRAM. However, today's expectations of long-term equipment reliability and performance are adverse to memory cell failures which occur later during the useful lifetime of the equipment. Even if only one of the marginal memory cells of the DRAM fails later on, reliability and performance are impacted in ways that are not acceptable to the end user.

Therefore, to assure the long-term reliability and usability of the chip, marginally operating memory cells as well as failing memory cells must be removed from the configuration at the time of production testing. Marginally operating memory cells and failing memory cells are typically replaced with redundancy memory cells available on the chip. In this way, the DRAM remains addressable by devices external to the DRAM as one intact unit offering storage and retrieval of data over one continuous address space.

On the other hand, sometimes a large number of the memory cells of a DRAM chip exhibit the same degree of marginality. If the degree of marginality is not too extreme, for example, the refresh interval must be set to 64 ms instead of 128 ms, such marginality may be deemed to be acceptable when the particular chip is tagged and used for a particular purpose that is not considered to be "mission critical." In such case, the large number of marginal memory cells make redundancy replacement impractical or impossible; however, the degree of the marginality is considered acceptable for the particular purpose for which the chip is used. In a third case, both the number of marginal memory cells and their degree of marginality are so great that it is impractical to repair or use the chip as a marginally performing chip. In such case, the chip is identified to be scrapped.

Of course, the problem is how to identify and characterize marginally operating memory cells such that an informed decision can be made whether the marginal memory cells should be repaired and replaced with tested good redundancy cells, instead of being tagged and sold as a marginal chip, or otherwise scrapped.

It has been estimated that a single-bit failure is the most prevalent type of defect in a DRAM. Redundancy replacement designs of DRAMs typically allow a prevalence of single bit failures of up to about 1%. Single-bit failures frequently result from variations in the manufacturing process which affect either the capacitance of the storage capacitor element of the DRAM cell, or cause leakage current off the DRAM cell to exceed limits. While such failures are frequently manifested during production testing under standard operating conditions, more severe test conditions are required to investigate marginal DRAM cells.

Many DRAMs include memory cells or "DRAM cells" which have only one capacitor and one transistor, the transistor being used as a passgate device or "pass-gate transistor" for controlling the reading and writing of the DRAM cell.

In a DRAM cell a datum is stored as a charge on the storage capacitor. The pass-gate transistor is turned on to write the datum to the DRAM cell, and to read the datum that is stored in the DRAM cell. Because the datum is stored as a charge on a capacitor, it has a tendency to weaken over time due to a small amount of current that inexorably flows off of the capacitor as "leakage current". For that reason, DRAM cells require periodic refreshing to restore, i.e. "recharge" the stored charge in the DRAM cell to a desirable level to maintain signal margin. However, not all DRAM cells of a DRAM can store a given amount of charge for the same time interval. Some DRAM cells which have relatively large leakage currents must be refreshed at more frequent intervals than other DRAM cells. It is the identification and characterization of such cells having larger leakage currents that needs to be performed better at time of production testing.

A particularly promising way of performing such testing of DRAM cells is by performing "write-window" testing. A "write-window" test seeks to identify and characterize marginal memory cells of a DRAM by varying the electrical operating conditions for reading and writing memory cells to a point which stresses the ability of the memory cells to retain stored data between successive refresh intervals.

In a "write-window" test, the time interval allotted to write a datum into a memory cell is shortened. This results in a smaller amount of charge being stored on the capacitor element of the memory cell than during normal operation. If the memory cell is then read after the refresh interval (or longer predetermined period of time) has passed, the faithfulness or lack thereof displayed by the memory cell in retaining the stored datum indicates whether the memory cell passes or fails during the stressed operating condition defined by the shortened writing interval.

In performing such "write-window" testing, it is desirable to test using a range of shortened writing intervals, in order obtain results having desirable granularity. Heretofore, it has not been possible to achieve a desired level of granularity when using available external test equipment to test advanced DRAM chips. Problems of attempting such testing are best illustrated with reference to the prior art organization of a DRAM shown in FIG. 1, and an illustrative prior art timing diagram provided in FIG. 2.

FIG. 1 illustrates an internal organization of a DRAM 100 which includes a DRAM array 102 having memory cells disposed at the intersections of wordlines 104 and bitlines 106. The wordlines of the DRAM array 102 are operated ("accessed") by wordline driver (WL DRV) circuitry 108, a particular driver of which is selected by row decoder (ROW DEC) circuitry 110. Data is read from or written to memory cells on an accessed wordline of the array 102 via the bitlines 106, as latched from, or driven by sense amplifier and precharge circuitry (SA/PCHG) 112, respectively. SA/PCHG 112 also functions to precharge, i.e., reset to a predetermined voltage, the bitlines between accesses of wordlines. In this way, signals that are read from or written to the memory cells when wordlines are accessed will transition in predictable ways. The SA/PCHG 112 exchanges read or write data with an external data input/output interface 114 of the DRAM 100 through second sense amplifier circuitry (SSA) 116. SSA 116 functions to transfer a typically limited set of data bits on a selected column or set of columns with the SA/PCHG 112, the limited set of data bits being determined by a column address (COL ADDR) provided to a column decoder (COL DEC) 118. Similarly, a row address (ROW ADDR) provided to the row decoder 110 determines the particular wordline to be accessed during a given memory access cycle. The column address and the row address are typically provided from an address bus or address control interface which may include column predecoder circuitry and row predecoder circuitry, as incorporated in the element referenced in FIG. 1 as address control element 120.

A controller 122 generates many of the control signals needed to operate the DRAM including a column address strobe (CAS) signal which times the operation of the column decoder 118 and a row address strobe (RAS) signal which times the operation of the row decoder 110. Typically, the controller 122 also controls operation of the DRAM 100 to refresh the memory cells of the DRAM array 102 by providing a number "y" of control signal lines to the address control element 120 for controlling which addresses of the DRAM array 102 are presented to be refreshed, as well as the timing and control of the presentation of addresses for reading, writing refreshing the DRAM array 102. In addition, the controller 122 may also provide an autoprecharge timing signal ("APCHG"), which is timed in relation to the beginning of a DRAM read or write cycle (for example, as timed in relation to the RAS signal or WL_EN signal that the controller generates to time wordline decoding and driving operations). Such autoprecharge timing signal times the beginning of the bitline precharge interval to generally or closely coincide with the time that the accessed wordline is deactivated. For example, the autoprecharge timing signal is designed to begin the precharging of the bitlines at the same time that the accessed wordline is deactivated; i.e., "deselected," as by disabling the WL_EN signal. In addition to the autoprecharge timing signal, the controller 122 outputs a select (SEL) signal for selecting between an external precharge timing signal (PCHG) and the autoprecharge timing signal (APCHG) generated by the controller 122. Using the autoprecharge timing, the bitline precharging operation begins at a fixed interval of time after a particular wordline is activated using the WL_EN signal. By contrast, the external precharge signal (PCHG), arriving from external circuitry, e.g., external test equipment, is not so constrained. The external precharge signal PCHG can be timed to transition at various times, all depending upon the capability of the external test equipment and the fidelity of the signal channel from the test equipment into the DRAM 100 on the chip. However, there is a problem in that getting PCHG to transition at desired timings poses insurmountable challenges, as will become apparent in the following.

FIG. 2 will now be described as an example of difficulties encountered when write-window testing is attempted using available external test equipment. In one way of performing write-window testing, a datum is "strongly" written to a memory cell at one logic level, e.g., logic "LOW" or logic "0". Subsequently, a datum having the opposite logic level, e.g., logic level "HIGH" or logic "1", is written to the same memory cell. Then, the prescribed interval for refreshing the memory cell is allowed to pass, after which the memory cell is then read. The act of weakly writing the "1" can be performed by shortening the active duty cycle of the wordline for that write operation. Curve 150 of FIG. 2 illustrates a voltage level on a wordline of the prior art DRAM array 100 shown in FIG. 1. When the voltage level on the wordline is low, the wordline is not active, such that the passgate transistors of the memory cells connected to that wordline are turned off and the memory cells are not accessed at that time. On the other hand, when the voltage level on the wordline is high, the wordline is activated such that the pass-gate transistors of the memory cells connected thereto are turned on, and those memory cells are then accessed. At such time that the wordline voltage level is high, charge stored on capacitors of the memory cells begins to flow out of the capacitors onto the bitlines connected to each of the memory cells.

During normal operation, at time 152, the voltage on the wordline transitions from the low, inactive level to the high, active level. After the wordline is activated, the memory cells connected to that wordline can then be read, written or refreshed, the reading operation combining the latching and outputting the read data to SSA 116 (and on to the data I/O interface 114 (FIG. 1)), as well as refreshing all the memory cells connected to the wordline. At a later time 154, the wordline transitions again from the high voltage level to low voltage level. At that time, the memory cells are blocked from access, and the charge stored on the capacitors thereof is maintained until the next wordline access. This is followed by at least a minimum interval of time 156 required to precharge the bitlines of the DRAM 100 prior to the next activation of the same wordline. During such "precharge interval" 156, the voltages on non-accessed bitlines are reset to a predetermined voltage.

Thereafter, at a time 158, the DRAM is controlled to write a "0" to a memory cell. Preferably, the "0" is "strongly" written to the memory cell, i.e., written in a way which normally results in the voltage stored on the capacitor reaching the desired logic level. As shown in FIG. 2, at time 158, the wordline transitions to the active, high voltage level and a "0" is written to a memory cell that is accessed by the activated wordline. Once the "0" has been written the voltage level, the wordline is again lowered to the low voltage level at time 160. In order to "strongly" write the memory cell, the writing operation represented by the interval of time between times 154 and 160 can be repeated one or more times at the same logic "0" level after the initial writing operation.

Thereafter, at a later time 162 during operation, the memory cell is written to the logic "1", i.e., the high level. However, this time, the writing operation is conducted using a shortened time interval for activating the wordline, ending at time 163, such that the "1" is only weakly written to the memory cell. Then, the accessed wordline is again deactivated. In order to test the memory cell under a fully stressed condition, the wordline is then maintained low for a period of time at least as long as the refresh interval $t_R$, illustratively 128 ms, before being accessed again. The inactive period of time allows charge to escape from the capacitor of the memory cell via leakage current through any leakage paths which may be present. Thereafter, at time 164, the wordline is again activated and the contents of the memory cell are read therefrom.

At this time, when the memory cell tests good, the value of the datum read from the memory cell remains "1", despite the stressed conditions under which the "1" is initially written to the memory cell, and the long interval of time that elapses before reading the memory cell again. However, if the memory cell is one that performs marginally or fails under normal conditions, the value in the memory cell might appear as a "0" instead when read. In such way, the marginal or failing memory cell is identified through the write-window test.

However, as noted above, one goal of testing is to determine with sufficient granularity the stressed conditions under which memory cells fail. Available external test equipment does not satisfy this goal. Curve 170 illustrates a waveform input to a time demultiplexer 124 of DRAM 100 (FIG. 1) for controlling the timings at which wordlines of the DRAM 100 are activated, and a precharge control signal PCHG is applied to SA/PCHG 112 to precharge the wordlines in between activations of the wordlines. Referring to FIG. 2, the period to of the waveform between the rising edge of the WL_EN (wordline enable) signal and the PCHG (external precharge timing signal) defines the period for maintaining the wordline active.

Unfortunately, owing either to the external test equipment or the quality of the interface to the chip or both, the quality of the signal waveform 170 input to the DRAM 100 from the external test equipment is poor. This precludes this arrangement from providing adequate granularity in write-window testing. Pulse 172 of waveform 170 illustrates this point. The signal waveform arriving at demultiplexer 124 (FIG. 1) has a rise time or "transition time" $t_T$ of approximately 20 ns and jitter $t_J$ of about 10 ns. The transition time $t_T$ and the jitter $t_J$ make the signal edges and duration of the WL_EN signal imprecise. While it is desired to vary the length of the wordline activation interval $t_W$ in 1 ns increments over a 20 to 30 ns range for write-window testing, the large jitter and long transition time according to the prior art arrangement shown in FIG. 1 preclude such testing from being performed.

Accordingly, a new DRAM circuit and method are desired which are capable of providing write-window testing with greater granularity than that provided heretofore according to the prior art.

SUMMARY OF THE INVENTION

Therefore, according to an aspect of the invention, a method is provided for varying a length of an active duty cycle of a wordline of a semiconductor memory. In such method, a variable autoprecharge timing is set to a first value. Thereafter, the wordline is activated at a first point in time, after which the wordline is autoprecharged at a second point in time that is determined at least partly by the first value, wherein the length of the wordline active duty cycle is defined by the length of time between the first and second points in time.

According to another aspect of the invention, a method is provided for testing a memory cell within a semiconductor memory which has a test mode interface. Such method includes activating the test mode interface of the semiconductor memory, and thereafter, entering information through the test mode interface to set a variable autoprecharge timing to a first value. The autoprecharge timing is measured between a start of an activation interval of a wordline and a start of a precharge interval.

A bitline connected to the memory cell is then switched to a first logic level. An external precharge signal is provided to the semiconductor memory, and the wordline is activated to write the memory cell according to the first logic level, wherein an ending point of the active duty cycle of the wordline is determined at least partly by the external precharge signal.

Thereafter, a signal is provided to select the autoprecharge timing, and the bitline is switched to a second logic level. The wordline is activated to write the memory cell according to the second logic level, the length of the wordline activation interval being determined by the first value. The contents of the memory cell are then read to determine whether the memory cell successfully retains the second logic level.

According to another aspect of the invention, a semiconductor memory is provided which is operable in at least a test mode. Such semiconductor memory includes a memory array, the memory array including a plurality of memory cells, which are accessible through a plurality of respective wordlines and a plurality of respective bitlines. A row decoder driver is operable to activate one wordline of the plurality of wordlines at a first point in time that is determined in relation to a first signal and to deactivate the wordline at a second point in time that is determined in relation to a second signal;

The semiconductor memory further includes a precharge circuit which is operable to precharge the bitline at a third point in time, the third point in time occurring no sooner than the second point in time. A variable length delay circuit is operable to output the second signal at a delayed timing after the first signal, the delayed timing being delayed in relation to the first signal, the delayed timing having a controllably variable length.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Thus, a new DRAM circuit and method are provided herein which is capable of enabling "write-window" testing to be performed by varying the timing at which autoprecharging is performed in the DRAM. Since the beginning of the autoprecharging cycle is timed through internal operation of the DRAM circuit disclosed herein, it can be much more precisely controlled, and with much greater granularity than in the arrangement described above as background to the invention.

Figure 3:
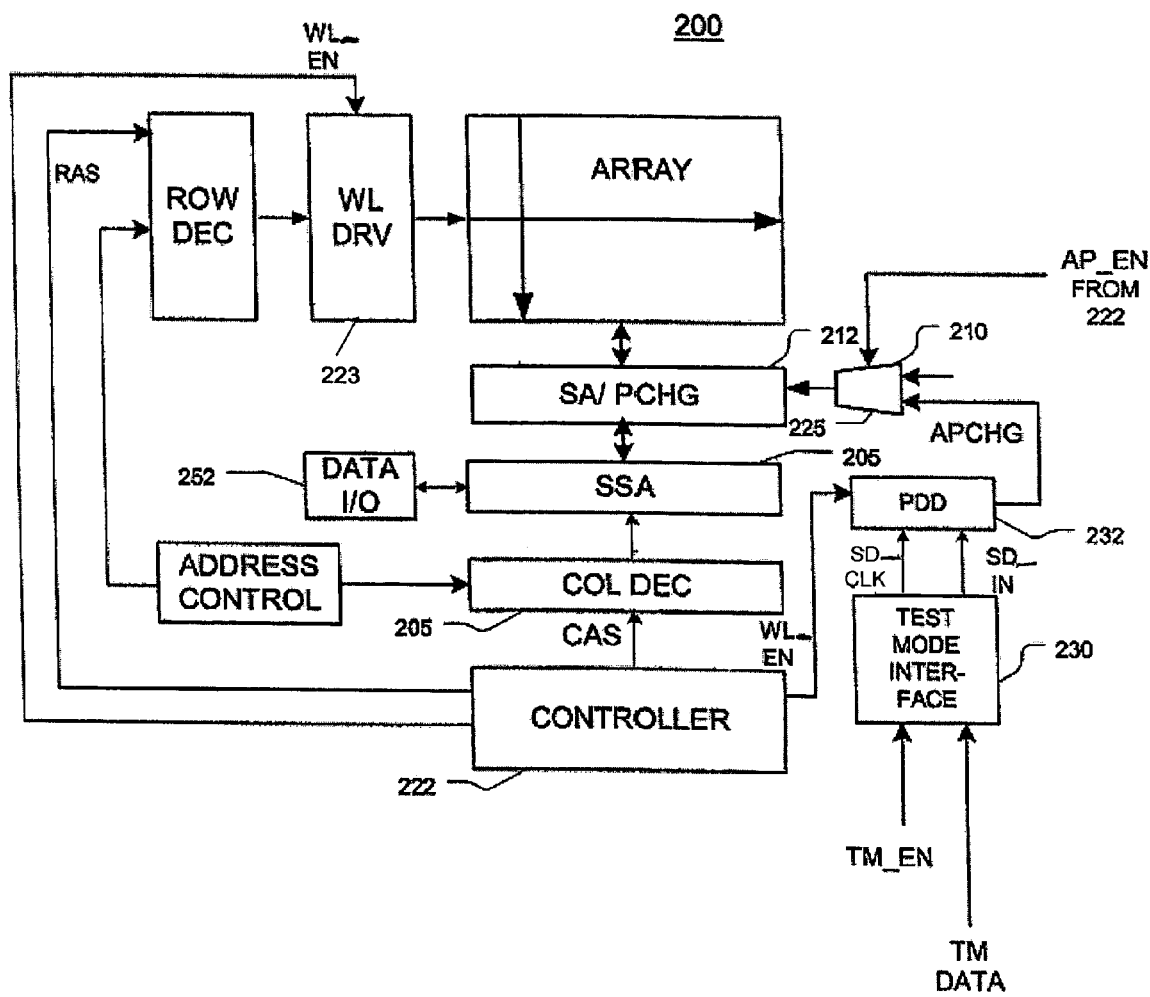
FIG. 3 is a block and schematic diagram illustrating an internal organization of a dynamic random access memory ("DRAM") according to one embodiment of the invention.

The embodiments of the invention will now be described with reference to FIGS. 3 through 6. FIG. 3 illustrates a DRAM 200 in accordance with an embodiment of the invention. As shown in FIG. 3, a test mode interface 230 of the chip is used to receive data (TM_DATA) when test mode operation of the DRAM 200 is enabled by signal TM_EN. The test mode interface 230 is preferably not a dedicated interface, but rather is available for receiving and latching scan data for use in different circuits of the chip, whatever their function may be and wherever on the chip they are. Test mode interfaces are commonly provided in some types of integrated circuits, particularly logic chips, for the purpose of diagnosing problems, and repairing and/or modifying circuits when it is desired to effect permanent or semi-permanent changes to a chip. For example, test mode interfaces are sometimes used to perform resets and to configure items into or out of the operational configuration of a chip. Thus, the test mode interface 230 shown in FIG. 3 may be used for purposes in addition to that which is expressly described herein. The output of the test mode interface 230 is a set of scan data (SD_IN) input to a programmable delay device ("PDD") 232, along with a scan data clock (SD_CLK) to time the latching of the scan data into the PDD. When active, the SD_CLK latches the scan data (SD_IN) into the PDD 232, which is then used to control the length of time between the activation of the wordline and its deactivation at the start of autoprecharging in the DRAM 200. Other elements of the DRAM 200 including ROW DEC, WL DRV, ARRAY, SA/PCHG 212, SSA, COL DEC, and DATA I/O device function in the manner described above for the corresponding elements of the prior art DRAM 100.

Figure 1:
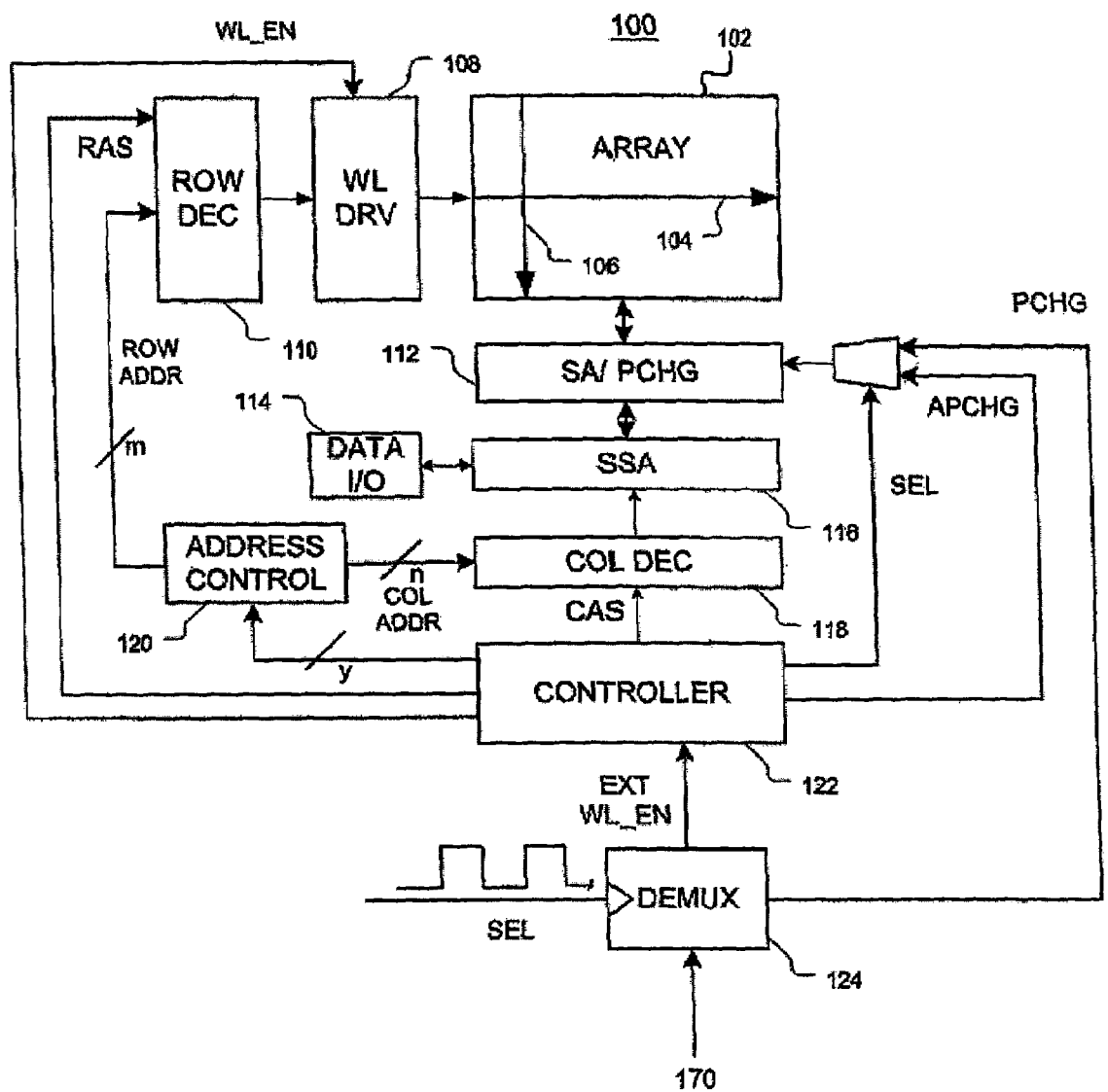
FIG. 1 is a plan view illustrating an internal organization of a dynamic random access memory ("DRAM") according to the prior art.
Figure 2:
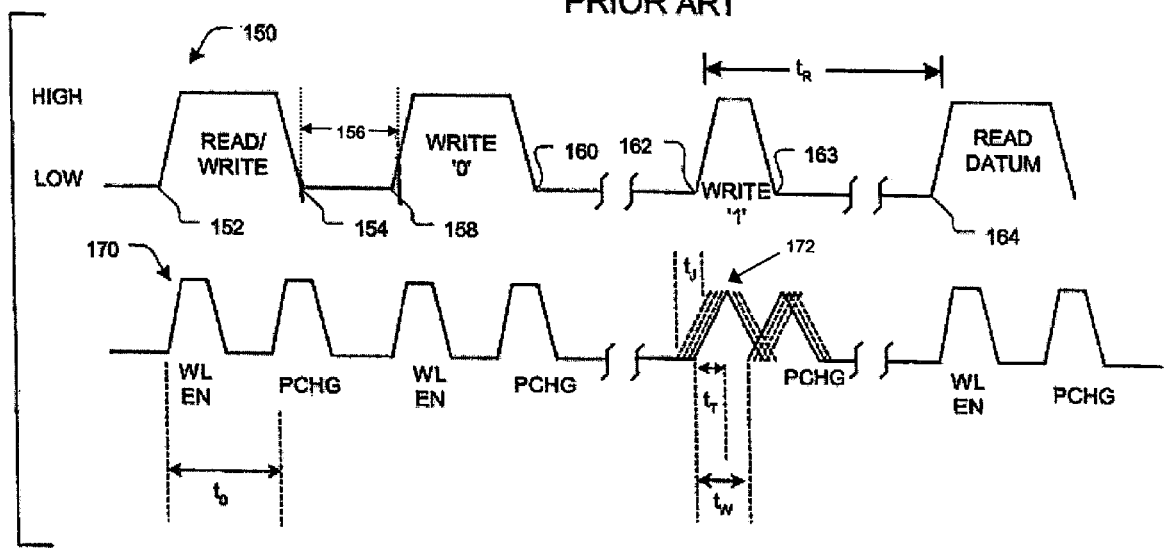
FIG. 2 is a timing diagram illustrating a "write-window" test of a DRAM performed according to the prior art.

As further shown in FIG. 3, the input to the PDD 212 is a wordline enable (WL_EN) signal output from a controller 222 of the DRAM 200. Controller 222 functions substantially as described above relative to FIGS. 1–2, except that controller 222 is capable of generating an autoprecharge enable (AP_EN) signal for controlling multiplexer 225.

Figure 4:
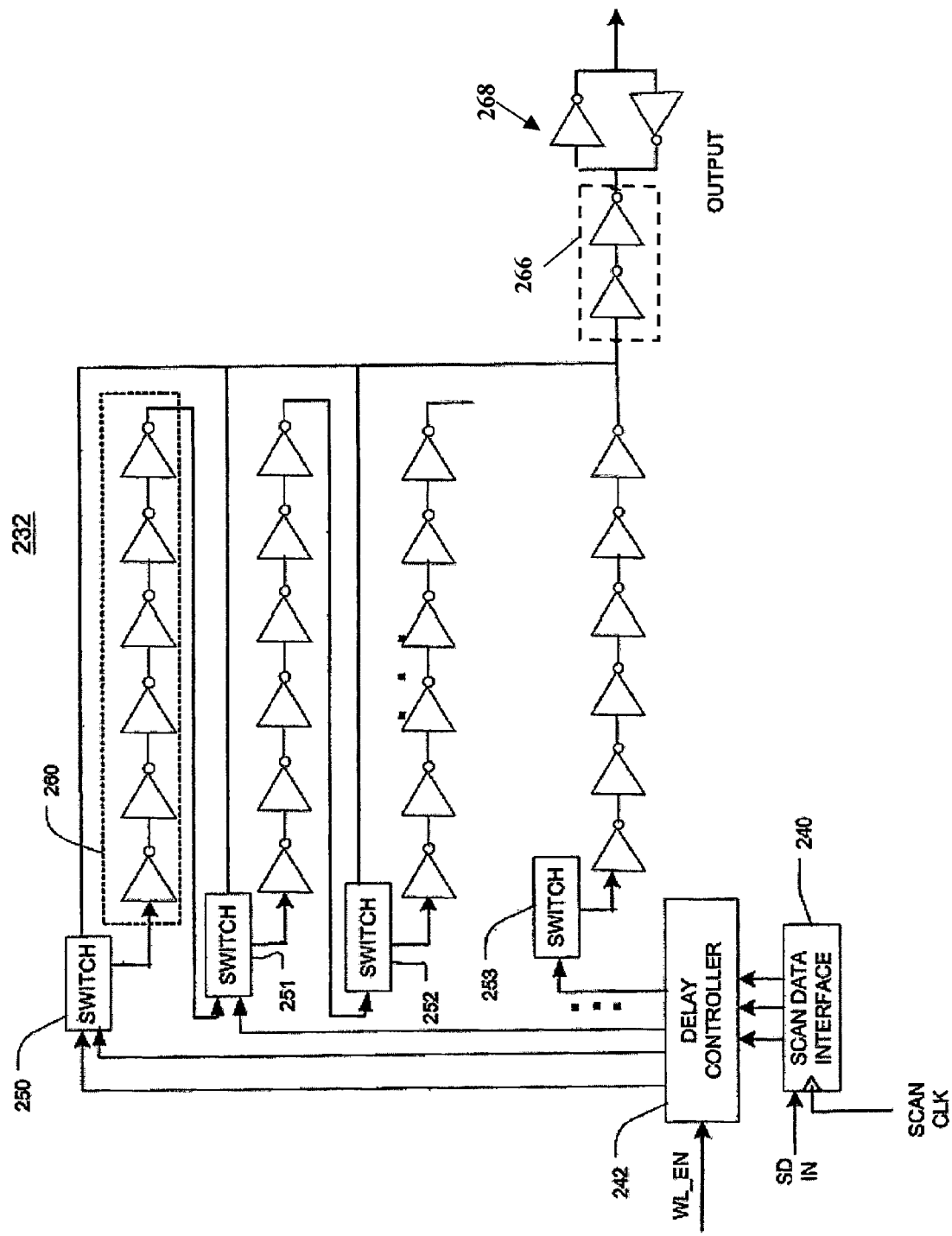
FIG. 4 is a block and schematic diagram illustrating an internal structure of a programmable delay device according to one embodiment of the invention.

FIG. 4 is a block and schematic diagram illustrating an internal organization of PDD 232. PDD 232 generates an autoprecharge timing signal ("APCHG"), which is timed to transition at a selected delay interval in relation to the wordline enable (WL_EN) signal that is input thereto by the controller 222. As shown in FIG. 4, the PDD 232 includes a scan data interface 240, including a serial input (shift) register which is capable of maintaining and outputting control signals in parallel to a delay controller 242. In this illustrative embodiment, the scan data interface 240 maintains and outputs encoded delay data representing a length of a variable portion of a delay. The delay controller 242, in turn, decodes the encoded delay data output by the scan data interface 240 into signals for operating switches 250 through 253 which programmably control the length of the total delay between the active edge of the WL_EN signal and the activation of the APCHG signal. For ease of illustration, four switches 250 through 253 are depicted in FIG. 4 for selecting the selectable delay elements 260. However, the number of selectable delay elements 260 is only illustrative, and need not be four or any other particular number.

Illustratively, each selectable delay element 260 is implemented by a chain containing an even number of inverter devices, e.g., six inverters, fabricated on the same chip as the DRAM 200. These chains of inverter elements are used as granular selectable delay elements 260 in a series of such elements for generating the APCHG signal. In such way, a precisely controlled delay is achieved by passing the WL_EN signal through a selected portion of the series of selectable delay elements. In one embodiment, all selectable delay elements implement a delay for the same length of time. In another embodiment, the selectable delay elements implement delays corresponding to different lengths of time. For example, in one embodiment, some of the selectable delay elements produce a delay of one unit length of time, e.g., 0.5 ns, while other delay elements implement longer delay intervals, e.g., 1 ns, 2 ns, 3 ns, 4 ns, or longer intervals. In a particular embodiment, the delay elements implement only delay intervals, which vary by integer powers of an exponent. For example, the delay elements can implement delay intervals which vary only by integer powers of two, e.g., to implement a series of delays having delay intervals . . . $2^{-2}$ (¼), $2^{-1}$ (½), $2^{0}$ (1), $2^{1}$ (2), $2^{2}$ (4), . . . By selecting delay elements having the same or different delay intervals, a total selected delay can be achieved by passing the signal through the series of selected delay elements. The switches 250 through 253 are double-acting switches, used to select whether the input to a particular one of the switches 250 through 253 is passed to a first output and on to the output of the PDD 232, after further isolation buffering and signal conditioning by isolation element 266 and latch 268. Alternatively, the input is passed on to the next selectable delay element 260 in the series of selectable delay elements.

Figure 5:
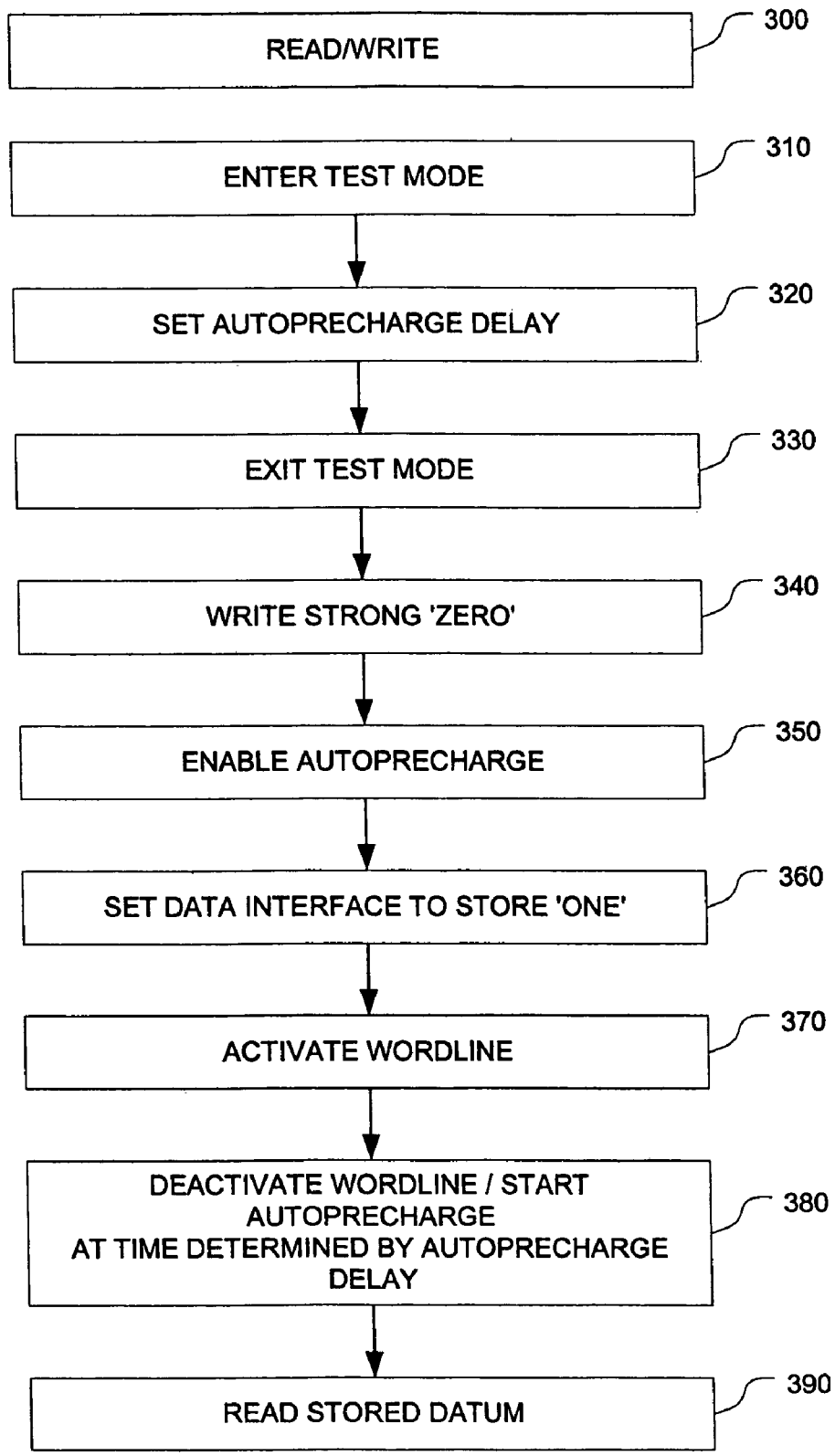
FIG. 5 is a flowchart illustrating a method for performing a write-window test according to one embodiment of the invention.

A method of performing a "write-window" test according to an embodiment of the invention will now be described with reference to the flowchart depicted in FIG. 5 and with continued reference to FIG. 3. In this embodiment, the timing of an autoprecharging operation of the DRAM 200 is controlled in accordance with the test mode interface 230 and programmable delay device 232 shown in FIG. 3. Control over whether the precharge cycle is timed by an external precharge signal (PCHG) or by autoprecharging is provided, for example, through a signal AP_EN output by controller 222, although in one embodiment, such control can be effected directly through an external signal input to the chip. The order in which operations are shown as performed in FIG. 5 is illustrative, in consideration of only a few of the operations, which must occur in a given sequence to perform the method.

Thus, in block 310, test mode operation of the chip is entered by presenting the TM_EN signal to the test mode interface 230. The autoprecharge delay is then set (block 320) by TM_DATA provided to test mode interface 230, which, in turn, is passed on to the PDD 232 as the scan data input signal SD_IN. The scan data input to PDD 232 is timed in accordance with the scan data clock SD_CLK, and used to program a selected delay timing to activate the APCHG signal to begin the autoprecharging cycle. As indicated by block 330, after setting the autoprecharge delay interval, test mode operation is exited, in order to permit normal read, write and refreshing operations of the DRAM to be performed.

Thereafter, the controller 222 of the DRAM is used to perform a series of writing and reading operations, which together make up the write-window test, to test the ability of individual memory cells of the DRAM array to retain a stored datum over a given interval of time.

Figure 6:
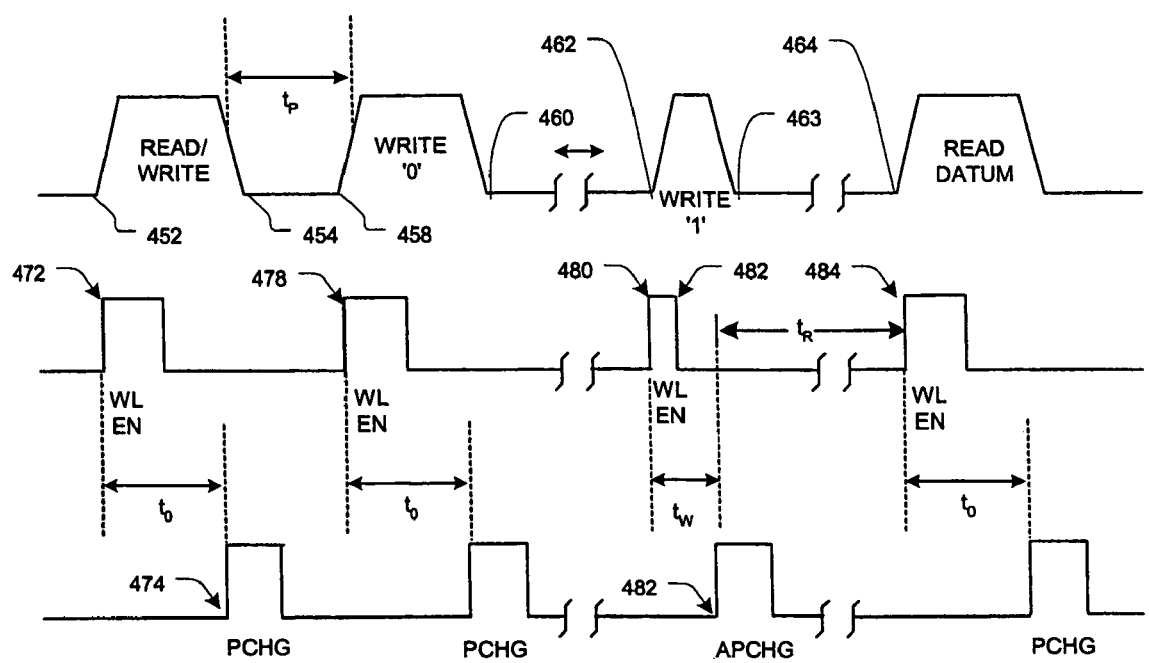
FIG. 6 is a timing diagram illustrating a "write-window" test of a DRAM according to one embodiment of the invention.

The operations depicted in flowchart are best understood with reference to the timing diagram provided in FIG. 6. Thus, at time 452, coinciding with the rising edge 472 of the WL_EN signal output by controller 222 (FIG. 3), a wordline of the DRAM 200 is activated, and memory cells connected to that wordline can then be read, written or refreshed. At a later time 454, which coincides with the active edge 474 of an external precharge signal ("PCHG"), the WL_DRV circuitry 223 (FIG. 3) causes the voltage on the wordline to transition again from the high voltage level to low voltage level, at which time the memory cells are blocked from access, and the charge stored on the capacitors thereof is maintained until the next wordline access. This is followed by at least a minimum interval of time $t_P$ that is required to precharge the bitlines of the DRAM 200 prior to the next activation of the same wordline. During such "precharge interval", voltages on non-accessed bitlines are reset to a predetermined voltage.

Thereafter, at a time 458, coinciding with the next active edge 478 of WL_EN, the DRAM is controlled to write a "0" to a memory cell. Preferably, the "0" is "strongly" written to the memory cell, i.e., written in a way which normally results in the voltage stored on the capacitor reaching the desired logic level. As shown in FIG. 6, the wordline is activated and a "0" is written to a memory cell that is accessed by the activated wordline. Once the "0" has been written, the voltage level on the wordline is again lowered to the low voltage level, at time 460. In order to "strongly" write the memory cell, the writing operation represented by the interval of time between times 454 and 460 can be repeated one or more times at the same logic "0" level after the initial writing operation.

Thereafter, the autoprecharge timing feature of the DRAM 200 is enabled by presenting the AP_EN to the DRAM, which then selects the APCHG timing signal output by PDD 232 for controlling the SA/PCHG circuitry 254 of the DRAM. Accordingly, once AP_EN is active, the next rising edge 480 of the next WL_EN timing signal triggers a delayed signal APCHG which times the wordline to be deactivated and the bitlines to be precharged at an autoprecharge timing. The autoprecharge timing is determined in accordance with the programmed delay interval previously set as described above with reference to blocks 310 through 330 of FIG. 5. Thus, at this point, the timing of the wordline activation and precharging operations of the DRAM are now ready to perform the "weak" writing of the "1" to an accessed memory cell to which the "0" was "strongly" written.

Accordingly, in block 360, this is done by setting the data I/O element 252 of the DRAM 200 to write a "1" to the DRAM and then activating the wordline (block 370) and maintaining the wordline active for only a shortened time interval $t_W$. That time interval $t_W$ is determined by the autoprecharge timing that was set previously in accordance with the method described above (referring to blocks 310 through 330).

Then, in block 380 the accessed wordline is again deactivated when the active edge of the APCHG signal occurs. To test the memory cell under a fully stressed condition, the wordline is then maintained low for a period of time at least as long as the refresh interval $t_R$, illustratively 128 ms, before being accessed again, the inactive period of time allowing charge to escape from the capacitor of the memory cell through any leakage paths which may be present.

Thereafter, at time 464, the wordline is activated again in accordance with the active edge 484 of the WL_EN signal, at which time the contents of the memory cell (block 390).

At this time, when the memory cell passes test criteria, the value of the datum read from the memory cell remains "1", despite the stressed conditions under which the "1" is initially written to the memory cell, and the long interval of time that elapses before reading the memory cell again. However, if the memory cell is one that performs marginally or fails under normal conditions, the value read from the memory cell can be "0" instead. In the case that the readout of the particular memory cell fails to produce a "1", the address of the failing location of the memory cell is recorded, e.g., by outputting the current address over an external interface to equipment located off the chip. In addition, the conditions under which the memory cell fails are also recorded.

Desirably, all of the memory cells of the DRAM are tested in accordance with the method described above with reference to FIG. 3. It is important to note that the changing of the autoprecharge timing delay can be performed at a particular time, and the strong "0" be written to all of the memory cells of one DRAM array under the control of controller 222. Thereafter, in this preferred method, the autoprecharge timing is then enabled by the AP_EN signal and then a weak "1" is written to all of the memory cells of the DRAM array. Autoprecharge timing is turned off again by deactivating AP_EN, such that the ending and length of future wordline activation intervals are timed by an external precharge signal PCHG, and those wordline activation intervals have length $t_0$.

Next, the interval of time $t_R$ is extended by which each of the wordlines of the array is accessed in turn after a designated retention period of time $t_R$ has elapsed. Such activation interval of wordlines is now the same as or optionally different from the standard refresh interval at which the DRAM is nominally refreshed. Thereafter, at time 464, triggered by the active edge 484 of the WL_EN signal, each memory cell of the DRAM is read out in the order that the memory cell was last written so as to test according to a uniform retention period for all memory cells of the chip.

The above method, performed using one autoprecharge delay timing, is desirably performed for different lengths of write-windows to characterize the DRAM. Each time, a different autoprecharge timing is set by presenting data and asserting the TM_EN signal at the test mode interface 230 (FIG. 3). By performing such write-window testing under different conditions, enough information can be gathered concerning the quality of memory cells of the DRAM to characterize the DRAM as: a) repairable, in which the locations of particular failing or marginal memory cells may be identified for repair; b) usable for a non mission-critical purpose, perhaps as subject to being repaired; or otherwise c) unrepairable and unusable such that the DRAM should be scrapped.

Another benefit made possible by the invention will now be described. As indicated above, the write-window testing performed in accordance with FIGS. 5 and 6 is done almost wholly using signals, i.e., the WL_EN signal, and APCHG, and using refresh timing signals which are generated by the controller 222 of the DRAM. Thus, in contrast to the prior art method discussed in the background to the invention, the method of this embodiment of the invention relies much more on signals generated internally within each DRAM. As a result, the external interface need not be tied up for as long in communicating signals to and from the memory. The chip may even include a plurality of the DRAM devices 200 shown and described above with reference to FIG. 3, each of which can have its own independent or semi-independent controller 222. In consequence, a high degree of parallelism can be achieved in testing the memory cells of the chip, in that even though the chip has only one external interface, the reliance of the method described herein on internally timed signals allows multiple controlled sections of the DRAM or multiple DRAMs of the chip to be tested simultaneously.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of varying a length of an active duty cycle of a wordline of a semiconductor memory, comprising:
   setting a variable autoprecharge timing to a first value;
   activating the wordline at a first point in time; and
   autoprecharging the wordline at a second point in time determined at least partly by the first value, the length of the wordline active duty cycle defined by the length of time between the first and second points in time.

2. The method as claimed in claim 1, wherein the second point in time is determined wholly by the first value.

3. The method as claimed in claimed in claim 1, wherein the length of the wordline active duty cycle is equal to the first value.

4. The method as claimed in claim 1, wherein the variable autoprecharge timing is set by entering information through a test mode interface of the semiconductor memory.

5. The method as claimed in claim 4, wherein the information is entered via a test mode operation of the semiconductor memory.

6. A method of testing a memory cell within a semiconductor memory having a test mode interface, comprising:
   activating the test mode interface of the semiconductor memory;
   entering information through the test mode interface to set a variable autoprecharge timing measured between a start of an activation interval of a wordline and a start of a precharge interval to a first value;
   switching a bitline connected to the memory cell to a first logic level;
   providing an external precharge signal to the semiconductor memory;
   activating the wordline to write the memory cell according to the first logic level, wherein an ending point of the active duty cycle of the wordline is determined at least partly by the external precharge signal;
   providing a signal to select the autoprecharge timing;
   switching the bitline to a second logic level;
   activating the wordline to write the memory cell according to the second logic level, wherein the length of the wordline activation interval is determined by the first value; and
   reading the contents of the memory cell to determine whether the memory cell successfully retains the second logic level.

7. The method as claimed in claim 6, wherein the reading step is performed after a predetermined time interval has elapsed after the writing of the memory cell according to the second logic level.

8. The method as claimed in claim 7, wherein the predetermined time interval includes a minimum retention time interval for retaining the stored contents of the memory cell prior to refreshing the memory cell.

9. The method as claimed in claim 8, wherein the semiconductor memory includes a dynamic random access memory and the memory cell includes a capacitive storage element.

10. A semiconductor memory operable in at least a test mode, comprising:
    a memory array including a plurality of memory cells accessible through a plurality of respective wordlines and a plurality of respective bitlines;
    a row decoder driver operable to activate one wordline of the plurality of wordlines at a first point in time determined in relation to a first signal and to deactivate the wordline at a second point in time determined in relation to a second signal;
    precharge circuit operable to precharge one of the plurality of bitlines at a third point in time, the third point in time occurring no sooner than the second point in time; and
    a variable length delay circuit operable to output the second signal at a delayed timing, delayed in relation to the first signal and occurring after the first signal, the delayed timing having a controllably variable length.

11. The semiconductor memory as claimed in claim 10, wherein the controllably variable length of time is determined by delaying the first signal.

12. The semiconductor memory as claimed in claim 11, wherein the variable length delay circuit includes a series of selectable delay elements.

13. The semiconductor memory as claimed in claimed in claim 10, further comprising a test mode interface operable to receive a control signal and to provide control information based on the control signal to vary the length of the delayed timing of the variable length delay circuit.

14. The semiconductor memory as claimed in claimed in claim 10, wherein the length of the wordline activation interval defined by the interval between activating the wordline and deactivating the wordline is equal to the delayed timing.

15. The semiconductor memory as claimed in claim 14, wherein the delayed timing is an auto-precharge timing.

16. The semiconductor memory as claimed in claim 10, further comprising a controller, the controller operable to provide control information to the variable length delay circuit to controllably vary the length of the delayed timing.

17. The semiconductor memory as claimed in claim 10 further comprising a refresh controller operable to control an operation to refresh a memory cell accessible by the wordline at a refresh timing after a given deactivation of the wordline.

18. The semiconductor memory as claimed in claim 17, wherein the memory cell includes a capacitive storage element and the refresh timing includes a minimum retention time interval for retaining the stored contents of the memory cell prior to refreshing the memory cell.

19. The semiconductor memory as claimed in claim 18, further comprising a sense amplifier (SA) circuit connected to the bitline, the SA circuit operable to drive a first logic level signal on the bitline to the memory cell during a first activation interval of the wordline, the first activation interval timed in relation to the first and second timing signals, the SA circuit further being operable to read the contents of the memory cell during a second activation interval of the wordline subsequent to the first activation interval.

20. The semiconductor memory as claimed in claim 19, wherein the second activation interval has a longer duration than the first activation interval.

* * * * *

UNITED STATES PATENT AND TRADEMARK OFFICE
CERTIFICATE OF CORRECTION

PATENT NO. : 7,072,234 B1
APPLICATION NO. : 11/048836
DATED : July 4, 2006
INVENTOR(S) : Nierle It is certified that error appears in the above-identified patent and that said Letters Patent is hereby corrected as shown below:

Column 5, Line 30: delete "to" and insert --$t_0$--
Column 11, Line 22: delete "in claimed"
Column 12, Line 25: delete "in claimed"

Signed and Sealed this

Nineteenth Day of September, 2006

JON W. DUDAS
*Director of the United States Patent and Trademark Office*